(12) United States Patent
DiVergilio et al.

(10) Patent No.: US 6,305,316 B1
(45) Date of Patent: Oct. 23, 2001

(54) INTEGRATED POWER OSCILLATOR RF SOURCE OF PLASMA IMMERSION ION IMPLANTATION SYSTEM

(75) Inventors: William F. DiVergilio, Beverly; Peter L. Kellerman, Essex; Kevin T. Ryan, Wilmington, all of MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/619,839

(22) Filed: Jul. 20, 2000

(51) Int. Cl.[7] .............................. C23C 16/00; H05H 1/00; H05H 1/46
(52) U.S. Cl. .................. 118/723 I; 118/723 E; 118/723 AN; 156/345; 315/111.51
(58) Field of Search ............... 118/723 E, 727 I, 118/723 AN; 156/345; 250/492.3, 492.21, 492.23; 315/111.51

(56) References Cited

U.S. PATENT DOCUMENTS

| | | |
|---|---|---|
| 3,832,648 * | 8/1974 | McDowell ........................ 331/74 |
| 3,958,883 * | 5/1976 | Turner ............................. 356/85 |
| 4,667,111 | 5/1987 | Glavish et al. . |
| 5,212,425 * | 5/1993 | Goebel et al. .................. 315/111.21 |
| 5,643,364 * | 7/1997 | Zhao et al. ...................... 118/723 E |
| 5,654,043 | 8/1997 | Shao et al. . |
| 5,911,832 * | 6/1999 | Denholm et al. ............... 118/723 E |
| 5,942,855 * | 8/1999 | Hopwood ........................ 315/111.51 |
| 6,027,601 | 2/2000 | Hanawa . |

* cited by examiner

Primary Examiner—Gregory Mills
Assistant Examiner—P. Hassanzadeh
(74) Attorney, Agent, or Firm—Eschweiler & Associates, LLC

(57) ABSTRACT

A wafer processing system is provided. The system includes a wafer handling system for introducing semiconductor wafers into a processing chamber. An oscillator is operatively coupled to an antenna for igniting a plasma within the processing chamber. The plasma and antenna form a resonant circuit with the oscillator, and the oscillator varies an output characteristic associated therewith based on a load change in the resonant circuit during plasma ignition.

19 Claims, 4 Drawing Sheets

INTEGRATED POWER OSCILLATOR RF SOURCE OF PLASMA IMMERSION ION IMPLANTATION SYSTEM

FIELD OF THE INVENTION

The present invention relates generally to Plasma Immersion Ion Implantation (PII) systems, and more specifically to a system and method for providing plasma ignition within a plasma chamber via an integrated power oscillator RF source.

BACKGROUND OF THE INVENTION

In a Plasma Immersion Ion Implantation (PII) process, a semiconductor wafer is placed in a plasma chamber (generally by a wafer handling system), a plasma is ignited, and wafer implantation occurs by pulsing the wafer at a negative potential. This process is repeated for each wafer. A significant challenge associated with PII is related to the repeatability of the process, and notably, one of the primary sources that may introduce variability into the process is related to the plasma ignition phase.

Referring initially to prior art FIG. 1, a conventional PII system 10 is shown. An RF power plasma source (not shown) is generally inductively or capacitively coupled to a plasma chamber 20. Plasma ignition is achieved when sufficient power is injected into the system 10 via an RF antenna 30 (shown as an inductor). Conventionally, power is injected into the system 10 from a fixed frequency (13.56 MHz) RF generator 40 through a 50 ohm coaxial cable 42 via a matching network 50. The matching network 50 is required to provide maximum power to the load by matching the 50 ohm output impedance of the RF generator 40 and a complex impedance established by the power antenna 30 and resultant plasma impedance 60 within the plasma chamber 20. The matching network 50 includes mechanically variable high voltage vacuum capacitors 50a and 50b. The tunable capacitors 50a and 50b account for variations in the antenna impedance caused by changes in plasma impedance 60 before, during and after plasma ignition. Capacitors 50a and 50b are employed to minimize "reflected power" back to the RF generator 40. The reflected power is monitored by a power meter 70, and a reflected power measurement is provided as an input 70a to an RF control 72. Based on the reflected power input 70a, the controller 72 directs a control output 72a to one or more motor drives 74 for adjusting the tunable capacitors 50a and 50b in order to minimize reflected power from the load. It is noted, that if the reflected power becomes too high, the RF generator 40 may fault. An external inductance 76 is depicted between the matching network 50 and the plasma chamber 20 and represents stray inductances associated with the system 10.

Generally, the antenna 30 impedance varies significantly during the plasma ignition phase versus the steady state phase due to the changes caused by the plasma impedance 60. As shown, the plasma impedance 60 may be roughly modeled as a parallel network containing an imaginary component (X) 60a and a real component (R) 60b. During the changes between plasma ignition and steady state, large adjustments of the tuning capacitors 50a and 50b are generally required to account for large values of reflected power due to changes in plasma impedance 60 during ignition. Even though tunability is achieved by capacitors 50a and 50b, the delivered power is often limited to a fraction of the RF generator 40 output capability, and in many cases, plasma ignition is achieved only by increasing the pressure in the plasma source or chamber.

The process of increasing and subsequently reducing pressure, in conjunction with varying the tuning capacitors 50a and 50b, may require more than 10 seconds to complete. This lengthy period of time may enable substantially large voltages to be induced on the antenna 30 and may result in substantial electric fields at the wafer—possibly endangering the devices on the wafer. It is noted that until the plasma is ignited wafers are exposed to the unshielded antenna fields. Furthermore, even before pulsing of the wafer, deposition may occur producing a surface concentration of dopant. Thus, variability in ignition times, source pressures, and voltage transients may result in variations in resultant implant characteristics—making tightly controlled repeatability exceedingly difficult to achieve. Still further, if the control system 72, and/or any of the related circuits 50, 70 and/or 74 fail, the plasma will be lost. Even if the control system 72 performs flawlessly, the system 20 is slow to react and move due to the tuning requirements discussed above.

Another conventional approach to solving the problem of matching a variable impedance plasma source to an RF generator, is by varying the frequency of the generator to maintain a resonant condition. However, this approach also requires a control loop which varies generator frequency to minimize reflected power. The control is generally not fast enough, however, to prevent fault conditions during large and rapid impedance variations as a result of plasma ignition. Thus, power must still be limited. Additionally, this approach generally only matches reactive load changes, and therefore a mechanically variable capacitor may still be required to match resistive load changes.

Consequently, there is a strong need in the art for a system and/or method to provide repeatable and reliable plasma ignition. Moreover, there is a strong need for a PIII system providing a substantially faster, repeatable and more economical plasma ignition process to alleviate the aforementioned problems associated with conventional PIII systems and/or methods.

SUMMARY OF THE INVENTION

The present invention is directed to an integrated power oscillator in a Plasma Immersion Ion Implantation System (PIII) which incorporates a plasma source antenna in the tank circuit of the power oscillator—resulting in generally automatic or immediate passive tracking of the antenna circuit resonant frequency. This enables virtually instant ignition of the plasma at pressures to about 0.5 mTorr. By integrating the oscillator and plasma antenna, conventional system components such as controls, tuning capacitors, coupling cables and power feedback meters are eliminated. As a result, substantially higher repeatability and performance is achieved over conventional systems. Moreover, since the oscillator is integrated with the plasma source housing and requires only a DC power supply (no RF generator), the present invention substantially reduces the complexity and parts count of the power system and thus provides lower cost and greater reliability over conventional systems.

More particularly, the present invention utilizes characteristics of the plasma source antenna (e.g., antenna inductance) and associated system parameters (e.g., plasma impedance, external system inductance) and incorporates these factors within a power oscillator tank circuit. Since plasma ignition causes significant parametric changes (e.g., plasma impedance changes affecting antenna impedance), the tank circuit and associated power supply are designed to operate across the variable parametric conditions within the plasma chamber. By incorporating the oscillator with the plasma source housing, load reflection and matching problems associated with conventional systems are substantially eliminated.

To the accomplishment of the foregoing and related ends, the invention comprises the features hereinafter fully described. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
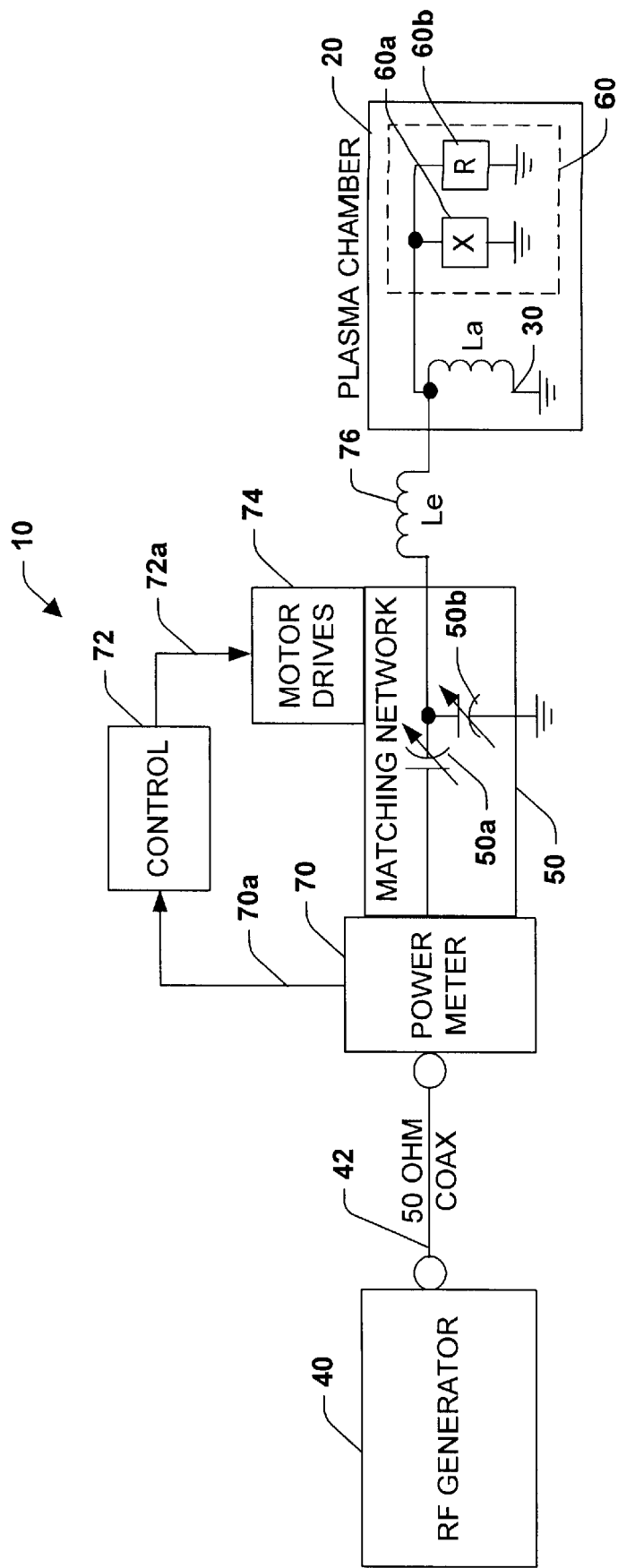
FIG. 1 is a schematic block diagram illustrating a prior art plasma ignition system and associated components in a PIII system.

The present invention will now be described with reference to the drawings wherein like reference numerals are used to refer to like elements throughout.

The present invention substantially mitigates plasma ignition and operation problems associated with conventional RF plasma power systems. Conventional control systems, matching networks, power meters, drives, cables and multiple RF amplifier stages are eliminated by incorporating existing PIII system parameters such as antenna and plasma impedance within an oscillator circuit designed to accommodate such parameters. By utilizing existing PIII system parameters, problems related to repeatability of plasma ignition, control system reliability, ignition time performance and associated higher system costs are substantially improved.

Figure 2:
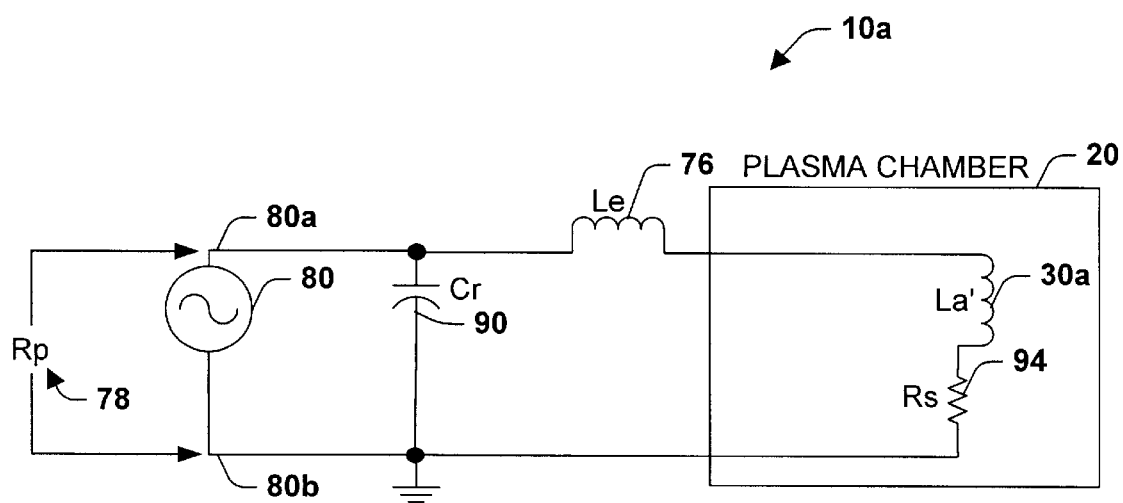
FIG. 2 is a schematic block diagram illustrating an integrated power oscillator system in accordance with the present invention.

Referring initially to FIG. 2, a schematic block diagram illustrates an integrated power oscillator system 10a for providing plasma ignition in a Plasma Immersion Ion Implantation (PIII) system in accordance with the present invention. It is to be appreciated that the system 10a is associated with a PIII system (not shown) for handling, processing and implanting dopants in semiconductor wafers (not shown). Since the wafer handling and processing are well understood in relation to PIII systems, further discussion related thereto is omitted for the purposes of brevity. It is further to be appreciated, that the present invention may also be employed to provide etching, ashing, and/or other semiconductor processes such as plasma processing of substrates. The present invention may also be employed with ultra low energy (ULE) and/or high energy (HE) ion implanters.

Referring now to FIG. 2 in detail, an integrated power oscillator is represented by its output resonant tank, including Cr 90, Le 76, La' 30a and Rs 94, and all other circuitry 80. Included in 80 are the active power device(s), which may be solid state or vacuum tube, output to input feedback circuitry, DC power supplies and other support circuitry. As with conventional systems, the plasma chamber 20 includes an antenna 30a which can be modeled as an inductance La', which includes plasma reactive effects. A series resistance model Rs 94 represents the output tank circuit dissipation, including the resistive part of the plasma load. Any added inductance external to the antenna is represented by Le 76. The output tank circuit capacitance 90 may include a plurality of capacitors and is selected to set the oscillation frequency to approximately 13.56 MHz. It is to be appreciated that a plurality of other suitable frequencies may also be selected and such variations are contemplated as falling within the scope of the present invention.

According to the model depicted by system 10a, a resonant resistance Rp 78 may be determined by analyzing the impedance as seen at nodes 80a and 80b. This resistance may be determined as:

$$Rp=(1+Q^2)*Rs. \qquad \text{Equation 1:}$$

wherein $Q=2\pi f(La'+Le)/Rs$.

The effective resonant resistance Rp 78 depends on antenna design, neutral gas species and pressure, and plasma conditions, and may be adjusted by choice of external inductance Le. Given values for La' and Le, the approximate operating frequency, f, is chosen by setting the value of Cr 90 as:

$$Cr=[(2\pi f)^2*(La'+Le)]^{-1}. \qquad \text{Equation 2:}$$

It is noted that system 10a is substantially non-linear due the dependence of Rs 94 on plasma density. However, it is sufficient to select system 10a design parameters based upon the highest value of Rs 94 which generally correlates to the highest plasma density. The value of Rs 94 is dependant on antenna 30 design, implant species, gas pressure and plasma density and is generally in the range of about 0.5 to 2 ohms. The unloaded (no plasma) value of Rs 94 is approximately 0.1 ohms.

The oscillator 80 according to one exemplary aspect of the present invention is designed to operate over the ranges of Rs 94 without adjustment so that resistive load changes are accommodated merely by DC power supply current (not shown in FIG. 2). The resistive load changes caused by changes in plasma density occur automatically on a time scale of less than about 1 millisecond. In addition, plasma reactive effects may decrease the value of La' 30a by about 20% from no load conditions to maximum power, which causes the tank resonant frequency to increase by at most about 10%. The oscillator 80, as will be described in more detail below, is designed according to one exemplary aspect of the present invention to operate within the frequency range caused by the plasma reactive effects without adjustment. Thus, reactive load changes are accommodated by changes in oscillator operating frequency which occurs automatically on a time scale of microseconds. Under plasma startup conditions, the unloaded value of Rs 94 is generally less than one fifth the fully loaded value. Since the resistance value presented at nodes 80a and 80b varies inversely with Rs 94, the oscillator 80 effectively sees a very large resistance during startup.

Figure 3:
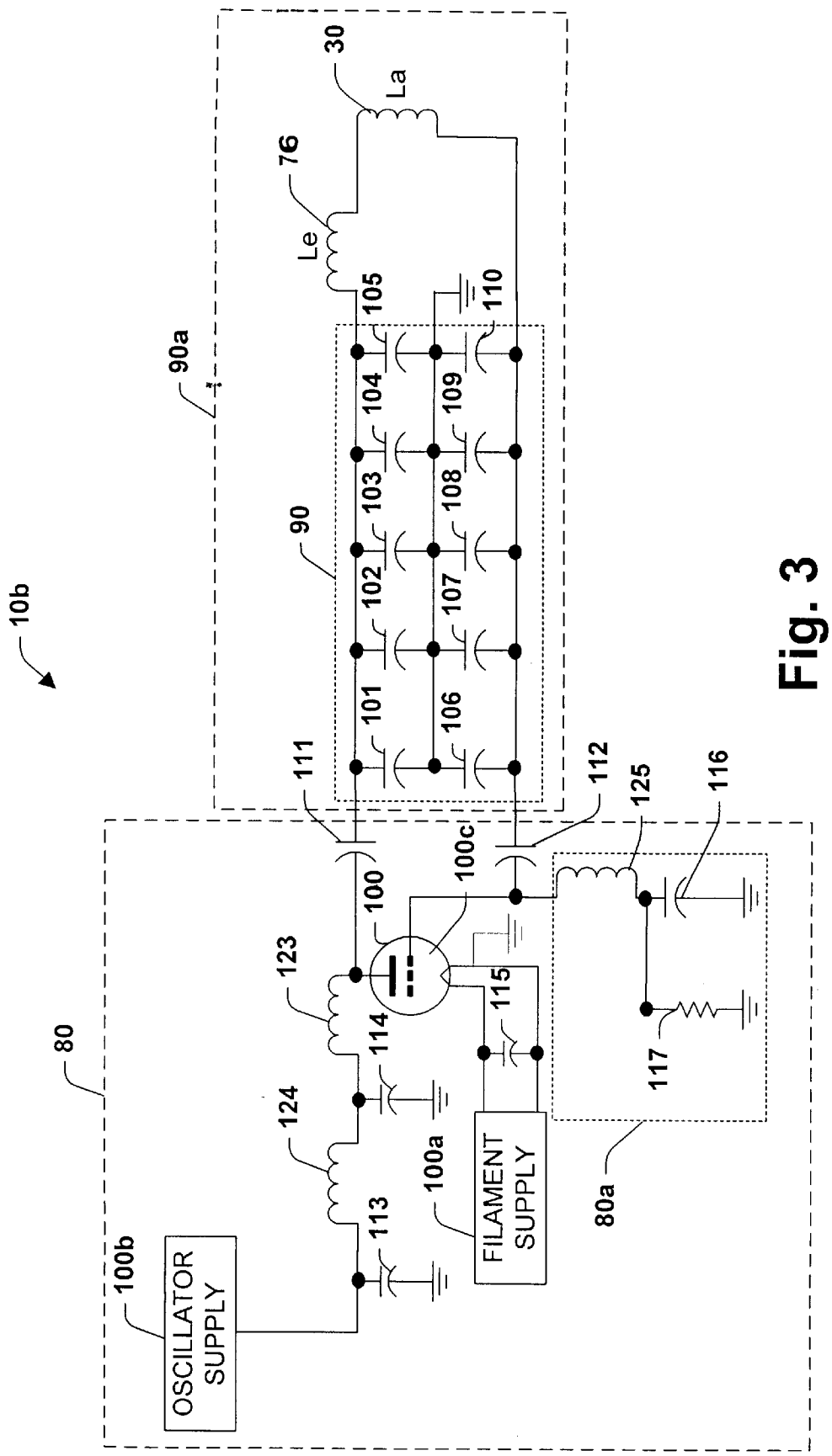
FIG. 3 is a schematic diagram illustrating an integrated power oscillator system in accordance with an exemplary aspect of the present invention.

Now referring to FIG. 3 in detail, a schematic diagram depicts an exemplary oscillator circuit 10b for providing plasma ignition and production in accordance with the present invention. Reference numeral 80 highlights an oscillator circuit including a vacuum tube 100, power supplies 100a and 100b, a bias network 80a and various filters which are described in more detail below. Reference numeral 90 depicts the oscillator output tank circuit capacitance and is represented by a bank of capacitors 101–110. The resonator capacitance 90 is selected to provide sustained oscillation with the oscillator 80, an external inductance Le 76, a plasma excitation antenna 30 and the plasma (not shown).

Oscillation of the system 10b is achieved by providing positive feedback from the output circuit 90a to the grid element 100c of the tube 100. Positive feedback to the grid element 100c provides a modulation of the tube 100 output current and thereby sustains oscillation. It is to be appreciated that a similar result may be achieved by providing positive feedback to a semiconductor device such as to the gate of a MOSFET and/or other transistor for example. DC bias of the grid 100c is obtained by passing the grid current to ground through a low pass filter, consisting of L125 (e.g., quarter wave choke, 2 kV, 0.2 A) and C116 (e.g., 1000 pF, 7.5 kVdc) and resister R117 (e.g., 2 kohm, 200 W).

By incorporating the antenna 30 and associated plasma impedance within an oscillator circuit 80, significant advantages are achieved over conventional plasma ignition systems. Since the antenna 30 and the associated plasma load are part of the oscillator output circuit, transmission lines and adjustable load matching networks associated with conventional power transmission systems are eliminated. Thus, plasma ignition and proper repeatability is substantially improved since changes caused by plasma impedance effects are accommodated by the oscillator 80 and resultant feedback from the load 90a. Moreover, system ignition time is substantially improved since tuning of a load matching network is no longer required. Still further, system costs are reduced and system reliability improved by eliminating power components such as controls, power meters, cables, matching networks, and drives associated with conventional systems.

As shown in FIG. 3, the vacuum tube 100 is employed to provided the oscillator circuit 10b output. Preferably, the vacuum tube 100, such as an air-cooled Eimac YC245 style, is selected to provide for a robust implementation of the present invention. The YC245 provides an output power rating of about 4 kW and maximum plate dissipation of about 1.5 kW. It is to be appreciated that other tubes may be chosen. It is further to be appreciated that solid state designs may be selected to implement the present invention such as a power MOSFET and/or other power switching designs.

The oscillator circuit 10b represents a Colpitt's style implementation. Plate-to grid positive feedback is developed through capacitor banks C101–C105 (e.g., approximately 25 pF, 15 kVdc) and C106–C110 (e.g., approximately 200 pF, 15 kVdc), respectively. Capacitors 111 and 112 (e.g., approximately 750 pF, 15 kVdc) provide AC coupling for the oscillator tube 100 output and feedback. It is noted that the capacitors in circuit 10b are selected as standard, low-cost, fixed-value RF transmitting capacitors, however, any type of capacitance may be utilized and is contemplated as falling within the scope of the present invention. It is further noted that values for external inductance Le 76 and antenna inductance 30 are, for example, approximately (0.2–0.6 uH) and (0.4–0.8 uH), respectively.

A power supply 100a provides heater power for the vacuum tube 100 filament and receives a 120 VAC input (not shown). The supply 100a is selected to be, for example, approximately 6.3 Vdc at about 25 A output capability. An RF bypass capacitor 115 is selected, for example, as approximately 1000 pF, 7.5 kVdc. An oscillator power supply 100b provides plate power for the vacuum tube 100 and receives a 208 VAC, three-phase input (not shown). The supply 100b is selected, for example, to be approximately 5 kVdc at about 0.8 A output capability. A low pass filter including capacitors 113, 114 (e.g., approximately 750 pF, 15 kVdc) and inductors 123, 124 couples the supply 100b output to the tube 100 plate. Inductor 123 is selected, for example, as a quarter wave choke, 1 kV pk and 1 A, and inductor 124 is selected, for example, as approximately 3 uH.

Figure 4:
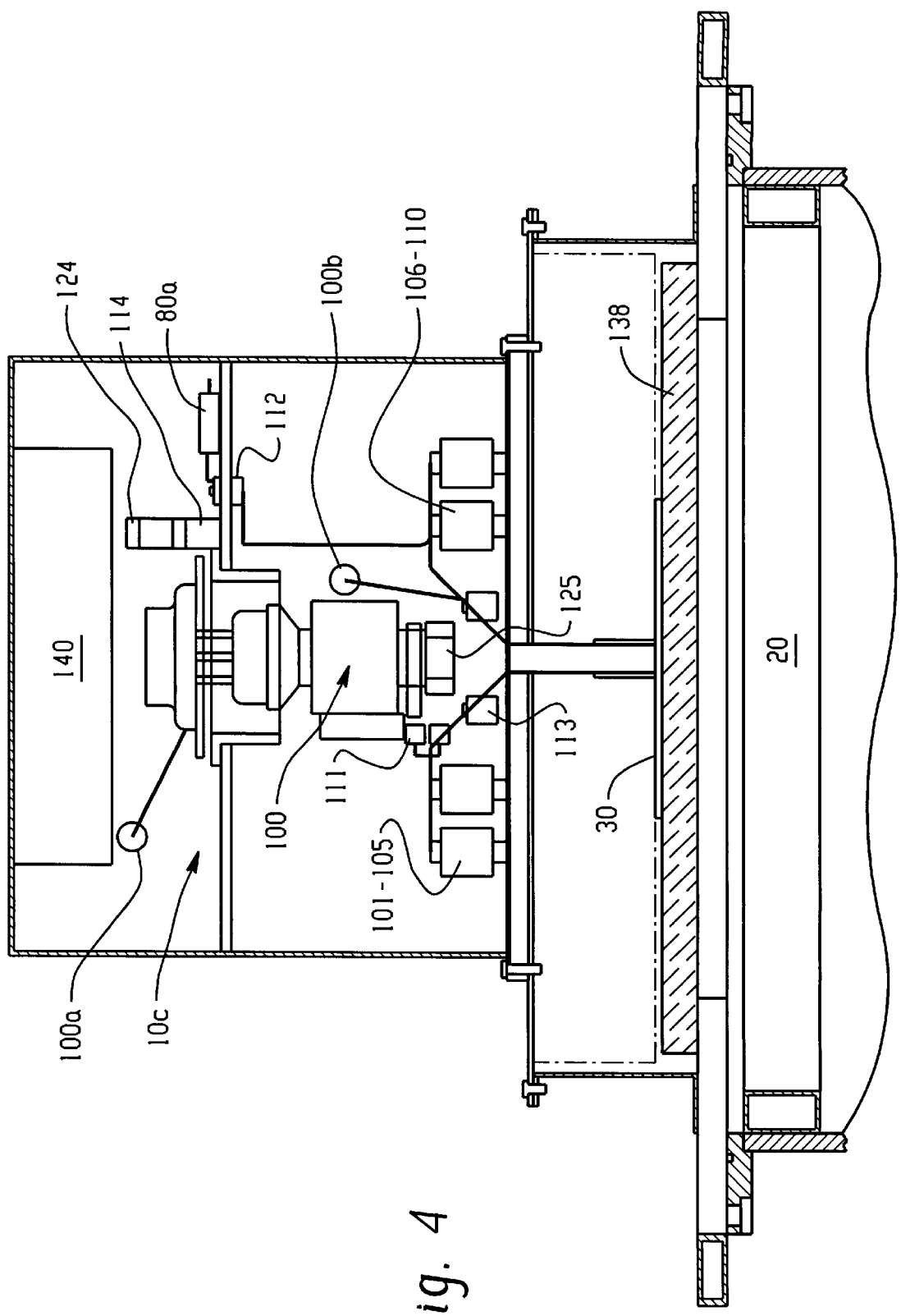
FIG. 4 is a system diagram illustrating a structural relationship between the integrated oscillator system and plasma source chamber in accordance with an exemplary aspect of the present invention.

Turning now to FIG. 4, a fragmentary structural diagram depicts an integrated power oscillator 10c and plasma chamber 20 in accordance with one aspect of the present invention. The vacuum tube 100 is shown operatively coupled to the antenna 30. The antenna 30 then couples energy via a quartz plate 138 to the plasma chamber 20 (a bottom portion which contains the wafer to be processed is not shown). A fan 140 provides cooling for the tube 100. As discussed above, by integrally mounting the oscillator, and providing circuit elements adaptable to changing plasma impedance conditions, the present invention provides substantial improvements over prior art systems—notably, repeatable plasma ignition, lower cost, higher reliability and faster ignition times.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In this regard, it will also be recognized that the invention includes a computer-readable medium having computer-executable instructions for performing the steps of the various methods of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An RF plasma generator system, comprising:
   an oscillator resonant circuit including an antenna for igniting and maintaining a plasma,
      wherein the plasma and antenna are part of the oscillator resonant circuit and form an oscillator resonant circuit load, and
      wherein an oscillator operating current, voltage and frequency automatically adapt to plasma conditions.

2. The system of claim 1, wherein an allowable range of oscillator operating current, voltage and frequency covers a desired range of plasma conditions.

3. The system of claim 1, wherein an active device within the oscillator comprises one or more vacuum tubes.

4. The system of claim 1, wherein an active device within the oscillator comprises one or more semiconductor devices.

5. The system of claim 1, wherein the oscillator resonant circuit comprises a Colpitt's style oscillator.

6. A processing system, comprising:
   a wafer handling system for introducing semiconductor wafers into a processing chamber; and
   an oscillator resonant circuit including an antenna for igniting and maintaining a plasma within the processing chamber,
      wherein the plasma and antenna are part of the oscillator resonant circuit, and wherein an oscillator operating current, voltage and frequency automatically adapt to plasma conditions.

7. The system of claim 6, wherein an allowable range of oscillator operating current, voltage and frequency covers a desired range of plasma conditions.

8. The system of claim 6, wherein the system comprises an ion implantation system.

9. The system of claim 6, wherein the system comprises an etching system.

10. The system of claim 6, wherein the system comprises an ashing system.

11. The system of claim 6, wherein an active device within the oscillator comprises one or more vacuum tubes.

12. The system of claim 6, wherein an active device within the oscillator comprises one or more semiconductor devices.

13. The system of claim 6, wherein the oscillator resonant circuit comprises a Colpitt's style oscillator.

14. An RF plasma generator system, comprising:
   a plasma chamber;
   an oscillator having first and second terminals; and
   an oscillator resonant circuit comprising:
      an antenna located in the plasma chamber and serially connected with a plasma in the resonant circuit for igniting and maintaining the plasma; and
      a capacitance connected across the plasma and the antenna;
      wherein the first and second terminals of the oscillator are connected across the capacitance, wherein the plasma and antenna form an oscillator resonant circuit load, and wherein an operating current, voltage and frequency associated with the oscillator automatically adapt to plasma conditions.

15. The system of claim 14, wherein an allowable range of oscillator operating current, voltage, and frequency covers a desired range of plasma conditions.

16. The system of claim 14, wherein the capacitance comprises a plurality of capacitors connected between the first and second terminals of the oscillator.

17. The system of claim 14, wherein the first and second terminals of the oscillator are AC coupled connected across the capacitance via first and second coupling capacitors.

18. The system of claim 14, wherein the oscillator comprises a vacuum tube with a grid element electrically connected to the second terminal of the oscillator, and wherein the resonant circuit provides positive feedback to the second terminal of the oscillator for modulation of the oscillator operating current, voltage, and frequency according to plasma conditions.

19. The system of claim 18, wherein an allowable range of oscillator operating current, voltage, and frequency covers a desired range of plasma conditions.

* * * * *

UNITED STATES PATENT AND TRADEMARK OFFICE
CERTIFICATE OF CORRECTION

PATENT NO.    : 6,305,316 B1
DATED         : October 23, 2001
INVENTOR(S)   : William F. DiVergilio, Peter L. Kellerman and Kevin T. Ryan It is certified that error appears in the above-identified patent and that said Letters Patent is hereby corrected as shown below:

<u>Title page, Item [54] and Column 1,</u>
Line 2, title, please replace the word "OF" with the word -- FOR --.

<u>Column 1,</u>
Lines 7, 14, 19, and 23, please replace the words "PII" with -- PIII --.

<u>Column 4,</u>
Lines 21-24, this equation should read:
-- Equation 1:
$Rp = (1 + Q^2) * Rs.$
wherein $Q = 2_{\pi}f(La' + Le)/Rs.$ --
Lines 31-34, this equation should read:
-- Equation 2:
$Cr = [(2_{\pi}f)^2 * (La' + Le)]^{-1}.$ --

Signed and Sealed this

Twenty-fifth Day of June, 2002

Attest:

Attesting Officer

JAMES E. ROGAN
*Director of the United States Patent and Trademark Office*